United States Patent [19]

Sugisawa et al.

[11] Patent Number: 4,693,944
[45] Date of Patent: Sep. 15, 1987

[54] SURFACE-COATED WEAR-RESISTANT MEMBER OF CERMET AND PROCESS FOR PRODUCING SAME

[75] Inventors: Taijiro Sugisawa; Akio Nishiyama, both of Yokohama, Japan

[73] Assignee: Mitsubishi Kinzoku Kabushiki Kaisha, Tokyo, Japan

[21] Appl. No.: 910,834

[22] Filed: Sep. 23, 1986

Related U.S. Application Data

[63] Continuation of Ser. No. 661,193, Oct. 15, 1984, abandoned.

[30] Foreign Application Priority Data

Oct. 21, 1983 [JP] Japan .................................. 58-197217

[51] Int. Cl.$^4$ .............................................. B32B 15/04
[52] U.S. Cl. .................................... 428/698; 427/215; 428/699
[58] Field of Search ....................... 428/698, 699, 404; 427/215

[56] References Cited

U.S. PATENT DOCUMENTS

| | | | |
|---|---|---|---|
| 4,406,668 | 9/1983 | Sarin et al. ........................ | 428/698 X |
| 4,409,003 | 10/1983 | Sarin et al. ........................ | 428/698 X |
| 4,409,004 | 10/1983 | Sarin et al. ........................ | 428/698 X |
| 4,474,849 | 10/1984 | Fujimori et al. ................... | 428/698 X |

*Primary Examiner*—Nancy A. Swisher
*Attorney, Agent, or Firm*—Cushman, Darby & Cushman

[57] ABSTRACT

A surface-coated wear-resistant member of cermet which includes a substrate of cermet and a hard coating vapor-deposited on a surface of the substrate. The coating is composed of at least one titanium compound selected from the group consisting of titanium carbide, titanium nitride, carbonitride of titanium, oxy-carbide of titanium, oxy-nitride of titanium and oxy-carbo-nitride of titanium. An atomic ratio of one of carbon, nitrogen, carbon plus nitrogen, carbon plus oxygen, nitrogen plus oxygen and carbon plus nitrogen plus oxygen to titanium(Ti) in the coating is in the range of between 0.3 and 0.8. The coating contains a compound of TiX and a compound of Ti$_2$X wherein X is one of carbon and nitrogen or at least two of carbon, nitrogen and oxygen. The coating may further includes titanium metal. The coating having an average thickness of 1 to 10 μm. There is also disclosed a process for producing such a surface-coated wear-resistant member.

7 Claims, No Drawings

SURFACE-COATED WEAR-RESISTANT MEMBER OF CERMET AND PROCESS FOR PRODUCING SAME

This is a continuation of application Ser. No. 661,193, filed Oct. 15, 1984, which was abandoned upon the filing hereof.

BACKGROUND OF THE INVENTION

1. Field of the Invention

This invention relates to a wear-resistant member of cermet, such as a blade member for a cutting tool, having a hard coating which exhibits excellent wear-resistance and toughness.

2. Prior Art

There have been extensively used surface-coated wear-resistant tool members, such as a blade member for a cutting tool, which comprise a substrate of cermet, such as cemented carbide including tungsten carbide (WC) and titanium carbidebased cermet, and a hard coating formed on a surface of the substrate and comprising one or more layers each composed of one of titanium carbide (TiC), titanium nitride (TiN), carbonitride of titanium (TiCN), oxy-carbide of titanium (TiCO), oxy-nitride of titanium (TiNO) and oxy-carbo-nitride of titanium (TiCNO). In some cases, such a coating further comprises an outermost layer of aluminum oxide ($Al_2O_3$) which is either in the amorphous form or the crystalline form.

Although such a conventional hard coating exhibits excellent wear-resistance, it is inferior in toughness, so that a crack can easily develop in the coating when the coating is subjected to bending stress during the operation of the wear-resistance tool member. In addition, this crack can be transmitted to the substrate of the tool member, so that the resistance of the tool member to breakage or damage is considerably lowered.

In order to overcome this difficulty, it has been proposed to form a coating of the above-mentioned titanium compounds by physical vapor deposition in such a manner that the thickness of the coating is kept as thin as possible and that the vapor deposition is carried out at temperatures of not more than 600° C. to make the structure of the coating fine and less crystalline. This coating on the wear-resistant tool member can be suitably deformed when subjected to bending stress to prevent a crack from developing in the coating, thereby ensuring that the resistance of the tool member to breakage is not lowered. This procedure has been found not entirely satisfactory, however, in that such a coating can not achieve a required wear resistance because the coating is thin and less crystalline.

SUMMARY OF THE INVENTION

It is therefore an object of this invention to provide a surface-coated wear-resistant member of cermet having a hard coating which, in addition to being highly wear-resistant, exhibits such excellent toughness that the coating can be suitably deformed when subjected to bending stress, thereby preventing a crack from developing in the coating.

Another object is to provide a process for producing such a surface-coated wear-resistant member.

According to a first aspect of the present invention, there is provided a surface-coated wear-resistant member of cermet which comprises a substrate of cermet; and a hard coating vapor-deposited on a surface of the substrate, the coating being composed of at least one titanium compound selected from the group consisting of titanium carbide, titanium nitride, carbo-nitride of titanium, oxy-carbide of titanium, oxy-nitride of titanium and oxy-carbo-nitride of titanium, an atomic ratio of one of carbon, nitrogen, carbon plus nitrogen, carbon plus oxygen, nitrogen plus oxygen and carbon plus nitrogen plus oxygen to titanium(Ti) in the coating being in the range of between 0.3 and 0.8, the coating comprising a compound of TiX and a compound of $Ti_2X$ wherein X is one of carbon and nitrogen or at least two of carbon, nitrogen and oxygen, and the coating having an average thickness of 1 to 10 μm.

According to a second aspect of the present invention, there is provided is a surface-coated wear-resistant member of cermet which comprises a substrate of cermet; and a hard coating vapor-deposited on a surface of the substrate, the coating being composed of titanium metal and at least one titanium compound selected from the group consisting of titanium carbide, titanium nitride, carbo-nitride of titanium, oxy-carbide of titanium, oxy-nitride of titanium and oxy- carbo-nitride of titanium, an atomic ratio of one of carbon, nitrogen, carbon plus nitrogen, carbon plus oxygen, nitrogen plus oxygen and carbon plus nitrogen plus oxygen to titanium(Ti) in the coating being in the range of between 0.3 and 0.8, the coating comprising titanium metal,a compound of TiX and a compound of $Ti_2X$ wherein X is one of carbon and nitrogen or at least two of carbon, nitrogen and oxygen, and the coating having an average thickness of 1 to 10 μm.

According to a third aspect of the present invention, there is provided a process for producing the above-mentioned surface-coated wear-resistant members. The coating of the above-mentioned construction is formed on the surface of the substrate by vapor-depositing at least one layer of titanium metal and at least one layer of titanium compound one upon another, the titanium compound being one of titanium carbide, titanium nitride, carbo-nitride of titanium, oxy-carbide of titanium, oxy-nitride of titanium and oxy-carbo-nitride of titanium.

The hard coating comprises a compound of TiX and a compound of $Ti_2X$ wherein X is one of carbon and nitrogen or at least two of carbon, nitrogen and oxygen, TiX and $Ti_2X$ being hereinafter referred to as "TiC.N.O" and "$Ti_2$C.N.O", respectively. The atomic ratio of one of carbon, nitrogen, carbon plus nitrogen, carbon plus oxygen, nitrogen plus oxygen, and carbon plus nitrogen plus oxygen to titanium (hereinafter referred to as "(C+N+O)/Ti") in the hard coating is in the range of between 0.3 and 0.8. With this construction, the hard coating has a fine structure and has such deformability or toughness as to absorb bending stress applied to the surface-coated wear-resistant member during an operation thereof, thereby preventing a crack from developing in the coating to ensure that the member is not subjected to breakage or damage. In addition, the hard coating possesses excellent wear-resistance which further enhances the overall wear-resistance of the member. The presence of titanium metal in the hard coating will further enhance the toughness of the coating.

If the atomic ratio, i.e., (C +N +0)/Ti, is less than 0.3, the proportion of $Ti_2$C.N.O plus titanium metal to TiC.N.O becomes too large, so that the hardness of the coating is lowered. As a result, the wear-resistance afforded by TiC.N.O is adversely affected. On the other hand, if the atomic ratio is more than 0.8, the proportion of Ti$_2$C.N.O to TiC.N.O or the proportion of Ti$_2$C.N.O plus titanium metal to TiC.N.O becomes too small, so that the coating fails to possess the required deformability (toughness) to absorb the bending stress applied to the hard coating during the operation of the surface-coated wear-resistant member.

The hard coating has an average thickness of 1 to 10 μm. If this thickness is less than 1 μm, the required toughness of the coating can not be achieved. On the other hand, if the thickness is more than 10 μm, the toughness of the coating is also lowered. The hard coating is vapor-deposited on the surface of the substrate of the member by chemical vapor deposition, a low-temperature chemical vapor deposition method using an organic agent, or various physical vapor deposition methods. Preferrably, in order that the resultant coating can be highly crystalline and excellent in wear-resistance, the coating should be vapor-deposited on the substrate at temperatures of 600° to 1,000° C.

In order that the hard coating comprises either TiC.N.O and Ti$_2$C.N.O or TiC.N.O, Ti$_2$C.N.O and titanium metal, alternate layers of TiC.N.O and Ti$_2$C.N.O can be vapor-deposited on the substrate surface. Alternatively, alternate layers of titanium metal and TiC.N.O can be vapor-deposited on the substrate surface, so that the compound of Ti$_2$C.N.O is formed by diffusion between each adjacent layers.

The hard coating may have an outermost layer of Al$_2$O$_3$ to further enhance its wear-resistance.

The invention will now be illustrated by the following examples:

EXAMPLE 1

There was prepared, as a substrate, a drawing die which was made of sintered cemented carbide which contained, apart from impurities, 12% by weight of Co and balance WC, the substrate having a hole extending therethrough for passing a material to be drawn therethrough. Then, seven layers of Ti metal each having an average thickness of 0.15 μm and seven layers of TiN each having an average thickness of 0.3 μm were alternately vapor-deposited one upon another at a temperature of 800° C. by an ion-plating method to form a hard coating of a laminated construction on the surface of the hole of the drawing die to provide a surface-coated wear-resistant drawing die of the present invention, the coating having an average thickness of about 3 μm.

For comparison purposes, a comparative drawing die of the conventional type was also prepared according to the above procedure except that a hard coating was composed of TiN, the coating having an average thickness of about 3 μm.

In the drawing die of the present invention, the atomic ratio of N to Ti was 0.65, and it was confirmed by X-ray diffraction that the hard coating contained both TiN and Ti$_2$N. The drawing die of the present invention had a transverse rupture strength of 290 kg/mm$^2$ while the comparative drawing die had a transverse rupture strength of 210 kg/mm$^2$ because the toughness of the coating was lower.

Also, the drawing die of the present invention and the comparative drawing die were used for drawing a stainless steel wire having a diameter of 2 mm at a reduction rate of 15%. The drawing die of the present invention became ineffective when it produced 3,000 m of drawn steel wire. On the other hand, the comparative drawing die became ineffective when it produced only 1,000 m of drawn steel wire. Thus, the service life of the drawing die of the present invention was substantially longer than that of the comparative drawing die.

EXAMPLE 2

There was prepared, as a substrate, a throw-away blade member or insert (ISO.P30) made of a sintered cermet containing, apart from impurities, 9% by weight of Co, 10% of TiC, 10% of TaC and balance WC. Then, six layers of Ti metal each having an average thickness of 0.2 μm and six layers of TiN each having an average thickness of 0.3 μm were alternately vapor-deposited one upon another at a temperature of 650° C. by an ion-plating method to form a hard coating of a laminated construction on a surface of the substrate to produce a surface-coated blade member A of the present invention, the coating having an average thickness of about 3 μm.

Also, a layer of Al$_2$O$_3$ having an average thickness of 1 μm was vapor-deposited on the coating of the blade member A by a plasma chemical vapor deposition method to produce a surfacecoated blade member B of the present invention.

In the coating of each of the blade members A and B, the atomic ratio of N to Ti was 0.55. It was confirmed by X-ray diffraction that each coating contained TiN, Ti$_2$N and Ti metal.

A comparative blade member of the conventional type was also prepared according to the procedure except that a coating was composed of TiN, the coating having an average thickness of about 3 μm.

The blade members A and B of the present invention and the comparative blade member were subjected to a continuous cutting test in a lathe. The conditions for this continuous cutting test were as follows:
Workpiece: a steel bar of a circular cross-section (JIS.SNCM-8; Hardness: HB240).
Cutting speed: 125 m/minute.
Feed rate: 0.32 mm/revolution.
Depth of cut: 1.5 mm.

An intermittent cutting test in a lathe was also carried out under the following conditions:
Workpiece: a steel bar having peripheral projections for engagement with the blade member (JIS.SNCM-8; Hardness: HB280).
Cutting speed: 100 m/minute.
Feed rate: 0.33 mm/revolution.
Depth of cut: 2 mm.
Cutting time: 2 minutes.

In the continuous cutting test, each blade member attached to a blade holder was used to continuously turn the workpiece to determine how long it took for the flank of the blade member to be worn 0.3 mm. In the intermittent cutting test, it was determined how many blade members of the same construction out of ten were subjected to chipping.

The results of the continuous and intermittent cutting tests are shown in TABLE below.

TABLE

| kind of blade member | Cutting time for 0.3 mm flank wear (min.) | Number of chipped blade members/number of tested blade members |
| --- | --- | --- |
| Blade member A | 25 | 0/10 |
| Blade member B | 43 | 1/10 |
| Comparative blade member | 26 | 9/10 |

As seen from TABLE, the blade member A of the present invention exhibited substantially the same wear-resistance as the comparative blade member, and the blade member B of the present invention was much superior in wear-resistance to the comparative blade member. None of the tested blade members A was subjected to chipping, and only one of the tested blade members B was subjected to chipping. On the other hand, nine of the tested comparative blade members were subjected to chipping. Thus, the hard coating of each of the blade members A and B exhibited much more toughness than that of the comparative blade member, and therefore achieved a higher cutting performance in the intermittent steel cutting test in which a substantial bending stress was exerted on the tested blade members.

EXAMPLE 3

There was prepared, as a substrate, a cold-forging die for forming a cross-shaped slot in a screw head which die was made of cemented carbide containing, apart from impurities, 20% by weight of Co and balance WC. Then, three layers of Ti metal each having an average thickness of 0.12 $\mu$m and three layers of $TiC_{0.2}N_{0.6}O_{0.2}$ each having an average thickness of 0.3 $\mu$m were alternately vapor-deposited one upon another at a temperature of 700° C. by an ion-plating method to form a hard coating of a laminated construction on a surface of the substrate to produce a surface-coated cold-forging die, the coating having an average thickness of about 1.3 $\mu$m.

In the coating of the cold-forging die of the present invention, the atomic ratio of C plus N plus O(C+N+O) to Ti was 0.7, and it was confirmed that the coating contained TiCON, $Ti_2N$ and Ti.

Also, a comparative forging die of the conventional type was prepared according to the above procedure except that a coating was made of $TiC_{0.2}N_{0.6}O_{0.2}$.

The cold-forging die of the present invention could process 200,000 screws (JIS.S55C) to form a cross-shaped slot in the head of each screw by cold forging before the cold forging die became ineffective. On the other hand, the comparative die could only process 50,000 screws before it became ineffective. Thus, the cold-forging die of the present invention had a substantially longer service life than the comparative die.

EXAMPLE 4

There was prepared, as a substrate, a throw-away blade member or insert made of a sintered cermet containing, apart from impurities, 5% by weight of Co, 10% of Ni, 10% of Mo, 20% of TiN and balance WC. Then, five layers of Ti metal each having an average thickness of 0.2 $\mu$m and five layers of $TiC_{0.3}N_{0.7}$ each having an average thickness of 0.4 $\mu$m were alternately vapor-deposited one upon another at a temperature of 900° C. by a sputtering method to form a hard coating of a laminated construction to produce a surface-coated blade member of the present invention, the coating having an average thickness of about 3 $\mu$m. The atomic ratio of C plus N (C +N) to Ti was 0.65, and it was confirmed that the coating contained TiCN and $Ti_2CN$.

A comparative blade member was also prepared according to the above procedure except that a coating was made of $TiC_{0.3}N_{0.7}$. The surface-coated blade member of the present invention and the comparative blade member were subjected to a turning test. The conditions for this turning test were as follows:

Workpiece: A grooved steel bar of a circular cross-section (JIS.SNCM-8; Hardness: HB270).
Cutting speed: 180 m/minute.
Feed rate: 0.3 mm/revolution.
Depth of cut: 2 mm.

In the turning test, it took 30 minutes for the blade member of the present invention to become ineffective while it took 20 minutes for the comparative blade member to become ineffective. Thus, the service life of the blade member of the present invention was substantially longer than that of the comparative blade member.

What is claimed is:

1. A surface-coated wear-resistant member of cermet comprising:
   (a) a substrate of cermet; and
   (b) a hard coating vapor-deposited on a surface of said substrate, said coating composed of at least one titanium compound selected from the group consisting of titanium carbide, titanium nitride, carbonitride of titanium, oxy-carbide of titanium, oxy-nitride of titanium and oxy-carbo-nitride of titanium, the atomic ratio of one of carbon, nitrogen, carbon plus nitrogen, carbon plus oxygen, nitrogen plus oxygen and carbon plus nitrogen plus oxygen to titanium (Ti) in said titanium compound being in the range of between 0.3 and 0.8, said titanium compound comprising TiX and $Ti_2X$ wherein X is one of carbon and nitrogen or at least two of carbon, nitrogen and oxygen,
   said TiX having a cubic structure, said $Ti_2X$ having a tetragonal structure and
   said titanium compound having an average thickness of 1 to 10 $\mu$m.

2. A surface-coated wear-resistant member of cermet comprising:
   (a) a substrate of cermet; and
   (b) a hard coating vapor-deposited on a surface of the substrate, said coating being composed of titanium metal and at least one titanium compound selected from the group consisting of titanium carbide, titanium nitride, carbonitride of titanium, oxycarbide of titanium, oxy-nitride of titanium and oxy-carbo-nitride of titanium, oxy-nitride of titanium and oxycarbo-nitride of titanium, the atomic ratio of one of carbon, nitrogen, carbon plus nitrogen, carbon plus oxygen, nitrogen plus oxygen nitrogen plus oxygen and carbon plus nitrogen plus oxygen to titanium (Ti) in said titanium compound being in the range of between 0.3 and 0.8,
   said titanium compound comprising titanium metal, TiX and $Ti_2X$ wherein X is one of carbon and nitrogen or at least two of carbon, nitrogen and oxygen, said TiX having a cubic structure, said $Ti_2X$ having a tetragon structure and said titanium compound having an average thickness of 1 to 10 $\mu$m.

3. A surface-coated wear-resistant member cermet according to claim 1 or claim 2, in which said coating further comprises a vapor-deposited outermost layer of $Al_2O_3$.

4. A process for producing a surrface-coated wear-resistant member of cermet, which comprises the steps of:
   (a) providing a substrate of cermet; and
   (b) forming a coating on a surface of said substrate, said coating formed by vapor-depositing alternately at least one layer of titanium (Ti) metal and at least one titaniium compound one upon another, said titanium compound being one of titanium carbide, titanium nitride, carbo-nitride of titanium, oxy-carbide of titanium, the atomic ratio of one of carbon, nitrogen, carbon plus nitrogen, carbon plus oxygen, nitrogen plus oxygen and carbon plus nitrogen plus oxygen to titanium (Ti) in said titanium compound being in the range of between 0.3 and 0.8, said titanium compound comprising TiX and $Ti_2X$ wherein X is one of carbon and nitrogen or at least two of carbon, nitrogen and oxygen, said TiX having a cubic structure, said $Ti_2X$ having a tetragonal structure, and titanium compound having an average thickness of 1 to 10 μm.

5. A process for producing a surface-coated wear-resistant member of cermet, which comprises the steps of:

(a) providing a substrate of cermet; and (b) forming a coating on a surface of said substrate, said coating formed by vapor-depositing alternately at least one layer of titanium metal and at least one titanium compound one upon another, said titanium compound being one of titanium carbide, titanium nitride, carbo-nitride of titanium, oxy-carbide of titanium, oxy-nitride of titanium and oxy-carbo-nitride of titanium, an atomic ratio of one of carbon, nitrogen, carbon plus nitrogen, carbon plus oxygen, nitrogen plus oxygen and carbon plus nitrogen plus oxygen to titanium (Ti) in said titanium compound being in the range of between 0.3 and 0.8, said titanium compound comprising titanium metal, TiX and $Ti_2X$ wherein X is one of carbon and nitrogen or at least two of carbon, nitrogen and oxygen, said TiX having a cubic structure, said $Ti_2X$ having a tetragonal structure, and said titanium compound having an average thickness of 1 to 10 μm.

6. A process according to claim 4 or claim 5, in which said coating further comprises a vapor-deposited outermost layer of $Al_2O_3$.

7. A process according to claim 4 or claim 5, in which the vapor-deposition of each layer is carried out at temperatures of between about 600° C. and 1,000° C.

* * * * *